United States Patent [19]

Birman et al.

[11] 4,107,620

[45] Aug. 15, 1978

[54] REGULATED POWER SUPPLY WITH AUTO-TRANSFORMER OUTPUT AND DIRECT CURRENT FEEDBACK

[75] Inventors: Paul Birman; Sarkis Nercessian, both of Flushing, N.Y.

[73] Assignee: Forbro Design Corp., New York, N.Y.

[21] Appl. No.: 731,461

[22] Filed: Oct. 12, 1976

[51] Int. Cl.² .......................... H03F 1/34; H03F 3/30
[52] U.S. Cl. .................... 330/265; 179/1 A;
179/1 F; 330/83; 330/276
[58] Field of Search ................. 179/1 A, 1 F; 330/83,
330/15, 13, 75, 81, 149, 265, 271, 276

[56] References Cited

U.S. PATENT DOCUMENTS

| 2,922,846 | 1/1960 | Humphreys | 179/1 F |
|---|---|---|---|
| 2,932,800 | 4/1960 | Bereskin | 330/15 |
| 3,066,188 | 11/1962 | Slaats et al. | 179/1 A |
| 3,365,545 | 1/1968 | Petrie | 179/1 F |
| 3,419,809 | 12/1968 | Lach | 330/83 |
| 3,462,698 | 8/1969 | Yagher | 330/15 |
| 3,500,218 | 3/1970 | Burwen | 330/15 |

OTHER PUBLICATIONS

"Voltage Regulator with High Accuracy Reference," R. D. Gillingham et al., IBM Technical Disclosure Bulletin, vol. 8, No. 12, May 1976, pp. 4130–4131.
"Op Amp's Current Booster Ends Crossover Distortion," J. Rodney Cox, Electronics, Mar. 29, 1971, p. 70.
"Audio Cyclopedia," Howard M. Tremaine, (H. W. Sams & Co., Inc., Indianapolis) 1969, p. 368.

Primary Examiner—Kathleen H. Claffy
Assistant Examiner—Kenneth A. Chayt
Attorney, Agent, or Firm—Alfred W. Barber

[57] ABSTRACT

A bipolar regulated power supply employing an autotransformer to couple the output to the load is provided with a direct current feedback connected directly across the load. In this way losses in the transformer and leads connecting to the load are compensated for and direct current is eliminated from the output transformer when the input is ac coupled.

3 Claims, 3 Drawing Figures

REGULATED POWER SUPPLY WITH AUTO-TRANSFORMER OUTPUT AND DIRECT CURRENT FEEDBACK

BACKGROUND OF THE INVENTION

For many years regulated power supplies and alternating current power amplifiers were developed along two different and well defined paths. Regulated power supplies were mainly unipolar and intended to provide very steady direct current output. Alternating current amplifiers were generally intended to amplify and provide alternating current output which was a faithful copy of the input signals.

With the development of programmable power supplies not only was direct current required at the output but they were also required to provide rapid changes in output and with a minimum of transient distortion. When two power supplies of opposite polarity were combined the basis for bipolar output was established.

Now, the bipolar power supply in an operational mode may be considered either a power supply or a power amplifier. Some of the refinements achieved in the development of operational power supplies now become unique advantages to them as power amplifiers. One notable area where this is true is in the matter of feedback. The uses and capabilities of feedback have become an important feature of operational regulated power supplies.

THE EXISTING NEED

Power amplifiers and operational power supplies are used in applications demanding the utmost in stability, faithful reproduction, freedom from transients, wide frequency response and a high degree of load regulation and damping. In the amplifier field, transformers have been used in the output at a sacrifice in several of the characteristics set forth above. In the power supply field direct coupling of the output has been used, sacrificing efficiency, in driving loads of different impedances.

THE PRESENT INVENTION

In accordance with the present invention the advantages of both power supply and amplifier techniques are combined to provide a new power supply / amplifier having unique and superior characteristics. An auto-transformer is provided to couple the output to the load. In order to avoid saturation in the inductance the input signal is AC coupled. The autotransformer provides the widest possible frequency response. The feedback is taken directly across the load so that transformer losses and losses in the leads from the transformer to the load are compensated. This latter is especially important since a large amount of feedback is used and the resulting damping factor might be seriously affected by connecting leads were the feedback not taken directly from the load. Still further improvement at output frequencies above 100 Hz is obtained by a second dc feedback path taken from the high side of the input to the auto-transformer and by mutually adjusting the two dc feedback resistors for optimum stability at the highest operating frequency.

Figure 1:
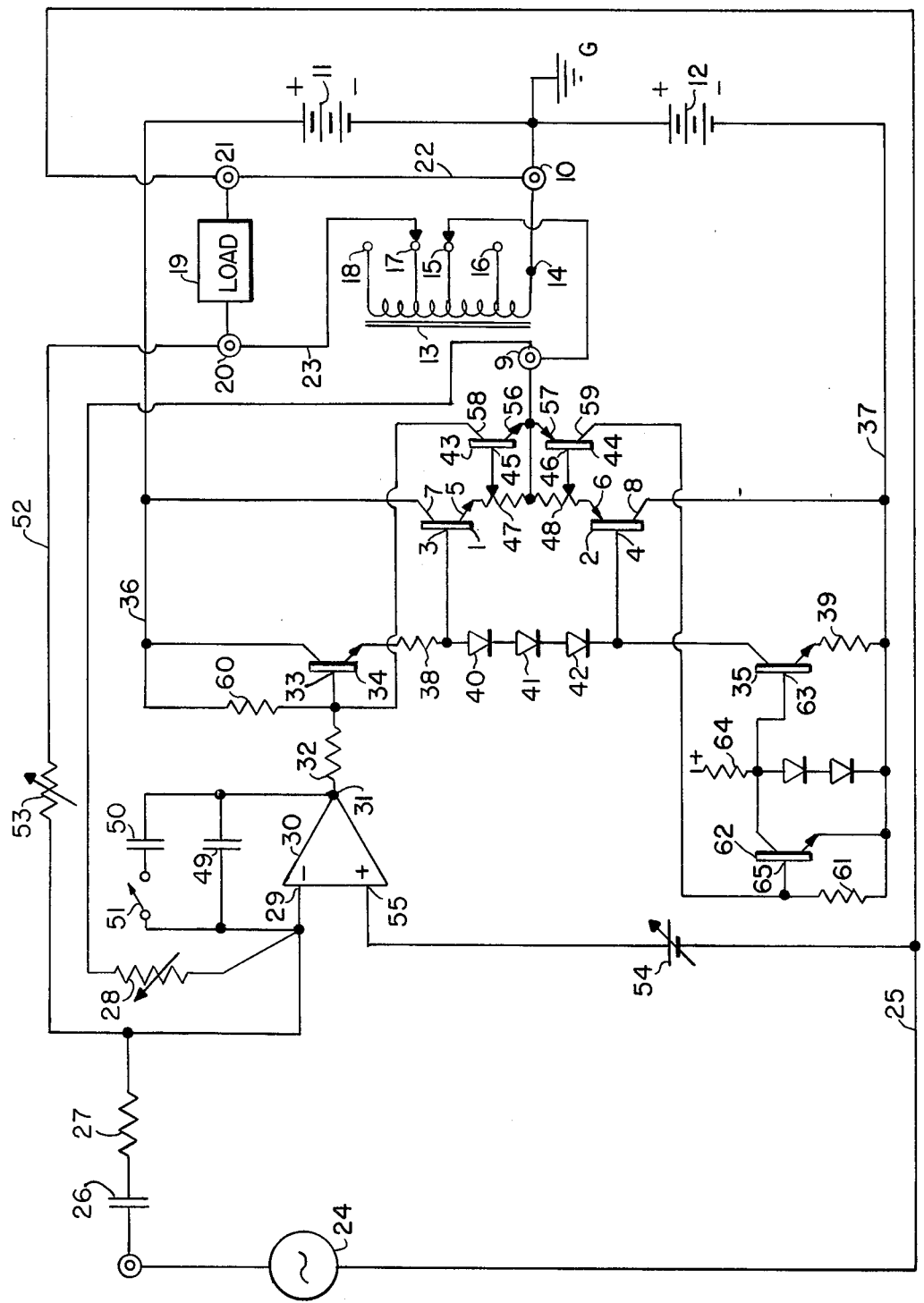
FIG. 1 is a schematic circuit diagram in simplified form of one form of the invention.

The output circuit of the power supply of FIG. 1 comprises the complementary power transistors 1 and 2 having bases 3 and 4, emitters 5 and 6 and collectors 7 and 8 respectively, Emitters 5 and 6 are connected through resistor 47 and 48 respectively to output terminal 9. The second output terminal 10 is connected to the junction between the source of unregulated positive voltage represented as battery 11 and the source of unregulated negative voltage represented as battery 12, which is generally also connected to ground G. The output terminals 9 and 10 are connected to an auto-transformer 13 between one end 14 and a tap 15. The auto-transformer is provided with any suitable number of additional taps as 16, 17 and 18 to provide a variety of predetermined ratios. As an example the taps could be made at 4, 8, 16 and 32 ohm impedance points. The load 19 to be powered having terminals 20 and 21 is connected between common terminal 10 and auto-transformer tap 17 over lines 22 and 23 respectively. A wide variety of turns ratios of auto-transformer 13 may be provided by changing the input connection 9 to any one of taps 15, 16, 17 and 18 and the load tap to line 23 to any one of these taps.

The power supply as shown is essentially a bipolar amplifier, that is, an amplifier which receives an alternating current input and provides an amplified alternating current output. The input is provided by an alternating current source 24 connected on one side to common line 25 and on the high side through coupling capacitor 26 and series resistor 27 to input terminal 29 of operational amplifier 30. The output terminal 31 of amplifier 30 is connected through current limiting resistor 32 to base 33 of driver transistor 34. Transistors 34 and 35 are connected between positive line 36 and negative line 37 and in series with resistors 38 and 39 and diodes 40, 41 and 42. These transistors provide drive current under control of amplifier 30 to bases 3 and 4 of complementary output transistors 1 and 2 respectively. The diodes 40, 41 and 42 provide an off-set so that both output transistors 1 and 2 are conducting in the cross-over region thereby eliminating cross-over distortion. In order to stabilize the system, suitable lag capacitors as 49 connected between output terminal 31 of amplifier 30 and inverting input terminal 29, and 50 selectable by means of switch 51 are provided.

An important feature of the invention is the overall feedback taken directly across load 19 over leads 25 and 52 through adjustable feedback resistor 53 to inverting input terminal 29 and through adjustable off-set voltage source 54 to non-inverting input terminal 55. It will be seen that this feedback circuit is a direct current path so that with the input signal source 24 coupled through capacitor 26 and resistor 27 to input 29 so that no direct current as applied from the source, any tendency for direct current to develop across load 19 and transformer 13 is effectively cancelled. The function of feedback resistor 28 will be described in detail below. This reduction or elimination of direct current in the auto-transformer effectively prevents saturation in this transformer permitting it to operate at highest efficiency and with optimum low frequency response. Also the feedback taken directly across the load provides an effective damping at the load without possible deterioration due to leads between the auto-transformer and the load which would take place were the feedback taken at the transformer. With the lagging across amplifier 30, the alternating current input signal coupling and the direct current feedback directly across the load, a system with large open loop gain can be provided with heavy effective feedback resulting in low distortion, cancellation of output direct current and a high damping coefficient. In addition the tapped auto-transformer provides efficient output drive to a wide range of load impedances.

Adjustable current limiting in both positive and negative polarities is provided by transistors 43 and 44. Emitters 56 and 57 are tied to output terminal 9. Base 45 is connected to an adjustable tap on emitter resistor 47 and collector 58 is connected to base 33 of driver transistor 34. When the current through transistor 1 produces a voltage drop in resistor 47 which causes the voltage on base 45 to exceed the emitter to base conduction voltage of transistor 43, current flows through resistor 60 to collector 58 limiting the bias on base 33 and thereby preventing any further increase in output current from transistor 1. In a similar manner base 46 of current limiting transistor 44 is connected to a variable tap on current sensing emitter resistor 48. Thus, when current flowing through output transistor 2 produces a voltage drop in resistor 48 which causes the voltage on base 46 to exceed the emitter to base conduction voltage of transistor 44, current flows through resistor 61 to collector 59 raising the potential of base 65 so that transistor 62 starts to conduct and cause current to flow through resistor 64 dropping the potential on base 63 of driver transistor 35 and thereby preventing further increase in drive current to output transistor 2. Thus both positive and negative current to the output of the power supply is limited and being independently adjustable, independent values of positive and negative current limits can be chosen at will.

Means are provided for supplying offset nulling voltage to the input of operational amplifier 30 in the form of an adjustable voltage represented by variable battery 54.

Figure 2:
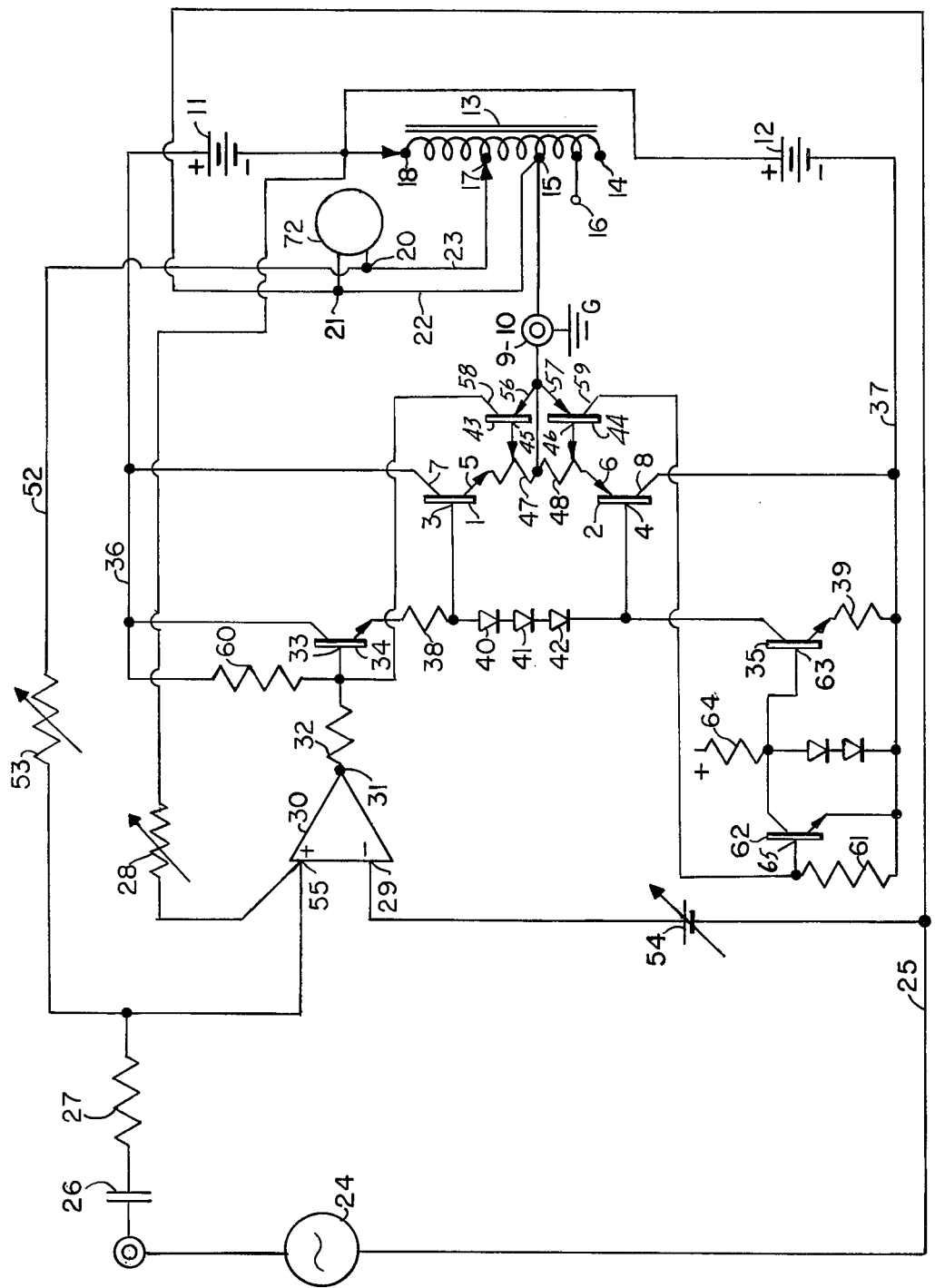
FIG. 2 is a schematic circuit diagram in simplified form of the preferred form of the invention.

FIG. 2 shows a circuit basically the same as that shown in FIG. 1 and described above except for the configuration of the output. Similar components are designated by the same numbers in both Figs. The output circuit of FIG. 1 can be described as an emitter follower circuit i.e. the load is effectively connected between the emitters of the output power transistors and ground. One of the problems which can be encountered with this circuit of FIG. 1 is due to the large drive voltage required on the bases of the output power transistors. With the load in series with the emitters, the base voltage must be equal to the output voltage plus the base to emitter drops in the power transistors.

The above described problem is solved by means of the circuit of FIG. 2. In this circuit the emitters 5 and 6 of the power output transistors 1 and 2 are returned directly to ground 9-10 through current sensing resistors 47 and 48 respectively. The input circuit to auto-transformer 13 is shown as being connected between terminals 15 and 18 since terminal 15 is connected to ground 9-10 and terminal 18 is connected to the return lines of collector bias source voltages 11 and 12 at junction 66. The load in this circuit is shown as motor 72 connected between autotransformer terminals 15 and 17. Feedback is taken directly across the speaker terminals 21 and 20 over low side return 25 and high side return 52. The polarity is reversed between the bases of the output transistors and the load which is countered by reversing the input terminal connections to amplifier 30.

A significant advantage of the circuit of FIG. 2 is that only a very small drive voltage is required at the bases of the power output transistors 1 and 2 regardless of the output voltage across the output connected portion of autotransformer 13. Thus, in such a circuit in order to provide high output voltages, only the power output transistors need to have high voltage handling capabilities.

It is to be noted that the load is connected to the autotransformer over "lines" 22 and 23. It becomes especially important to connect the feedback lines 25 and 52 directly to the load terminals 20 and 21 when lines 22 and 23 exhibit an impedance which is significant in comparison to the load impedance. With an 8 ohm load, leads having an impedance greater than 1 ohm can be considered significant.

A still further improvement has been found possible when the amplifiers of the present invention are operated at frequencies above about 100Hz. This improvement is provided by a second dc feedback path taken from the input side of the autotransformer, by selecting the resistance of this second feedback path dependent upon the maximum operating frequency and by increasing the resistance of the first feedback path also by an amount depending on the maximum operating frequency (see FIG. 3). The second feedback path to be effective in the circuit of FIG. 1 is in the form of adjustable resistor 28 connected between terminal 9, the high side of the input circuit to autotransformer 13 and inverting input terminal of operational amplifier 30 in common with the return connection of the first feedback path through adjustable resistor 53. The second dc feedback resistor 28 of FIG. 2 is connected between the high side of the input to auto-transformer 13 at the common return point 66 of the two collector bias sources 11 and 12 and non-inverting input terminal 55 of amplifier 30 also in common with the return connection of the first feedback path through adjustable resistor 53.

Figure 3:
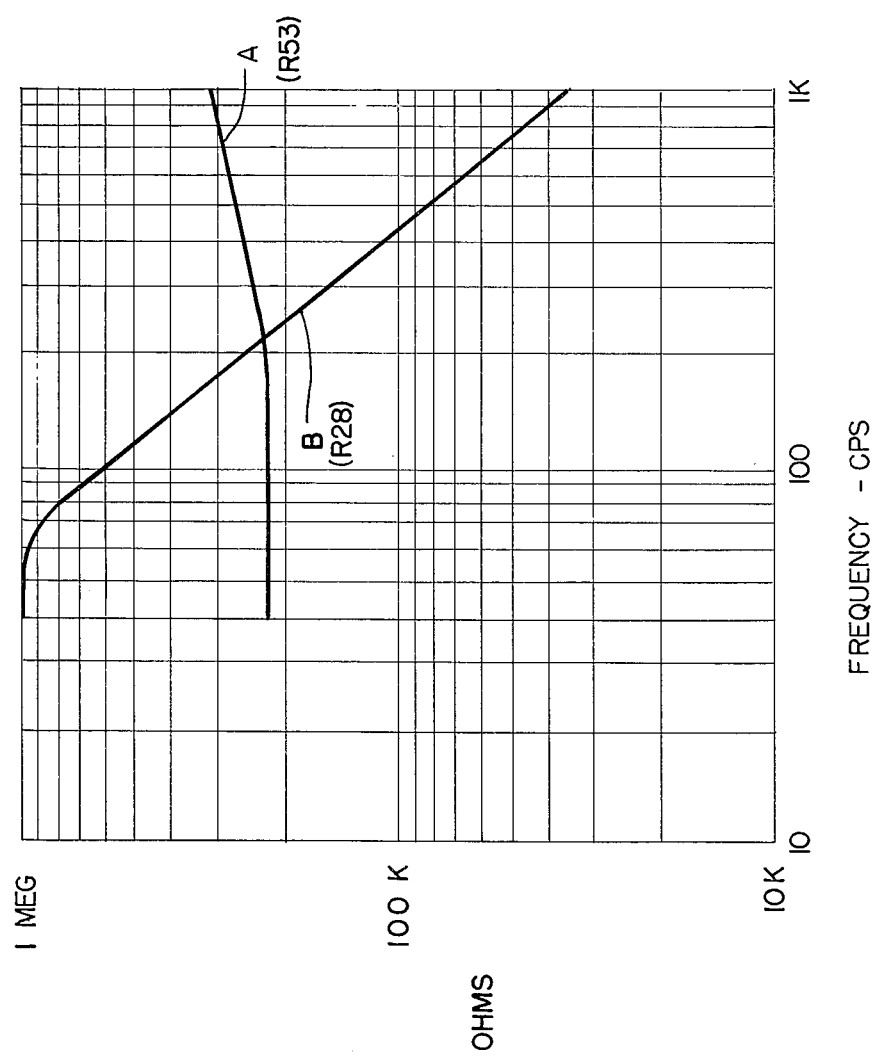
FIG. 3 is a graphical plot of feedback resistors required for optimum operation of the circuits of the invention.

FIG. 3 is a graphical representation of how resistors 28 and 53 are to be changed or varied for optimum operation at frequencies between 100 and 1000 cycles per second. The values plotted are for one particular amplifier and auto-transformer but are representative of the values to be used with other amplifiers and auto-transformers. It was found that for a given value of overall feedback resistor 53 that overcompensation took place as the frequency of the signals being amplified was increased above say 100 cycles. In order to restore uniform compensation (regulation) at higher frequencies it was found that resistor 53 should be increased in resistance and that the additional feedback resistor 28 should be added (see above). As the operating frequency is increased above about 100 cycles, resistor 53 is increased still further and resistor 28 is decreased as shown in the representative curves of FIG. 3.

While the preferred form and one additional form of the invention have been shown and described other forms are anticipated within the spirit and scope of the invention as set forth in the appended claims.

I claim:
1. In a bipolar power amplifier, the combination of;
   a pair of power transistors connected in series across a source of positive bias and a source of negative bias also connected in series;

an autotransformer at least a part of which is conductively connected between the common point between said two transistors and the common point between said positive and negative sources of bias;

bipolar direct coupled driving means coupled to the input means of said two transistors including amplifier means responsive to degenerative feedback;

a load means connected across at least a portion of said autotransformer;

and first feedback means directly connected between one side of said load means and a point in said amplifier means such that a degenerative circuit is created;

and wherein the connection between said load and said autotransformer is a line exhibiting a significant impedance in comparison with the impedance of said load.

2. In a bipolar power amplifier, the combination of;

a pair of power transistors connected in series across a source of positive bias and a source of negative bias also connected in series;

an autotransformer at least a part of which is conductively connected between the common point between said two transistors and the common point between said positive and negative sources of bias;

bipolar direct coupled driving means coupled to the input means of said two transistors including amplifier means responsive to degenerative feedback;

a load means connected across at least a portion of said autotransformer;

and first feedback means directly connected between one side of said load means and a point in said amplifier means such that a degenerative circuit is created;

and including a source of signals ac coupled to the input of said amplifier means;

and wherein said first feedback means is a direct current conductive means.

3. In a bipolar power amplifier, the combination of;

a pair of power transistors connected in series across a source of positive bias and a source of negative bias also connected in series;

an autotransformer at least a part of which is conductively connected between the common point between said two transistors and the common point between said positive and negative sources of bias;

bipolar direct coupled driving means coupled to the input means of said two transistors including amplifier means responsive to degenerative feedback;

load means connected across at least a portion of said autotransformer;

first feedback means directly connected between one side of said load means and a point in said amplifier means such that a degenerative circuit is created;

second feedback means connected between said common point between said two transistors and a point in said amplifier means such that a second degenerative circuit is created;

and wherein said first feedback means and said second feedback means are both adjustable direct current conductive means.

* * * * *